United States Patent
Guo et al.

(10) Patent No.: US 9,356,096 B2
(45) Date of Patent: May 31, 2016

(54) METHOD PROVIDING AN EPITAXIAL GROWTH HAVING A REDUCTION IN DEFECTS AND RESULTING STRUCTURE

(71) Applicant: MICRON TECHNOLOGY, INC., Boise, ID (US)

(72) Inventors: Song Guo, Xinyang (CN); Yushi Hu, Boise, ID (US); Roy Meade, Boise, ID (US); Sanh D. Tang, Boise, ID (US); Michael P. Violette, Boise, ID (US); David H. Wells, Boise, ID (US)

(73) Assignee: Micron Technology, Inc., Boise, ID (US)

(*) Notice: Subject to any disclaimer, the term of this patent is extended or adjusted under 35 U.S.C. 154(b) by 22 days.

(21) Appl. No.: 14/803,662

(22) Filed: Jul. 20, 2015

(65) Prior Publication Data
US 2015/0325645 A1 Nov. 12, 2015

Related U.S. Application Data

(62) Division of application No. 14/056,026, filed on Oct. 17, 2013, now Pat. No. 9,099,309.

(51) Int. Cl.
*H01L 29/04* (2006.01)
*H01L 29/06* (2006.01)
*H01L 21/02* (2006.01)
*H01L 21/762* (2006.01)
*H01L 29/32* (2006.01)

(52) U.S. Cl.
CPC ...... *H01L 29/0649* (2013.01); *H01L 21/02532* (2013.01); *H01L 21/02639* (2013.01); *H01L 21/02647* (2013.01); *H01L 21/76283* (2013.01); *H01L 21/76286* (2013.01); *H01L 29/04* (2013.01); *H01L 29/32* (2013.01)

(58) Field of Classification Search
CPC ............ H01L 21/02639; H01L 21/02647; H01L 21/76294; H01L 29/04; H01L 29/0649; H01L 29/32
USPC ............ 438/429, 44, 269, 360; 257/E21.092, 257/E27.112
See application file for complete search history.

(56) References Cited

U.S. PATENT DOCUMENTS

| | | | |
|---|---|---|---|
| 5,976,950 A | 11/1999 | DiSimone et al. | |
| 6,180,486 B1* | 1/2001 | Leobandung | H01L 21/762 257/347 |
| 6,555,891 B1* | 4/2003 | Furukawa | H01L 21/76262 257/347 |
| 7,389,014 B2* | 6/2008 | Kamins | B82Y 10/00 216/56 |
| 7,906,830 B2 | 3/2011 | Wells et al. | |
| 2003/0071321 A1 | 4/2003 | Hong | |
| 2006/0105536 A1* | 5/2006 | Cheng | H01L 21/823807 438/386 |
| 2010/0258852 A1* | 10/2010 | Lim | H01L 27/11551 257/324 |
| 2011/0049568 A1 | 3/2011 | Lochtefeld et al. | |

* cited by examiner

*Primary Examiner* — Kimberly Rizkallah
*Assistant Examiner* — Maria Ligai
(74) *Attorney, Agent, or Firm* — Wells St. John P.S.

(57) ABSTRACT

Disclosed are methods and resulting structures which provide an opening for epitaxial growth, the opening having an associated projection for reducing the size of the contact area on a substrate at which growth begins. During growth, the epitaxial material grows vertically from the contact area and laterally over the projection. The projection provides a stress relaxation region for the lateral growth to reduce dislocation and stacking faults at the side edges of the grown epitaxial material.

6 Claims, 11 Drawing Sheets

METHOD PROVIDING AN EPITAXIAL GROWTH HAVING A REDUCTION IN DEFECTS AND RESULTING STRUCTURE

CLAIM OF PRIORITY

This application is a divisional of U.S. patent application Ser. No. 14/056,026, filed Oct. 17, 2013, which is hereby incorporated by reference in its entirety.

TECHNICAL FIELD

Embodiments described herein relate generally to methods of forming crystalline structures employing an epitaxial growth, and the resulting structure.

BACKGROUND

Epitaxy refers to the deposition by growth of an overlayer on a crystalline substrate where the overlayer is in registration with the substrate. The substrate surface acts as a seed layer for the growth. Epitaxial material may be grown from gaseous or liquid precursors. Because the substrate surface acts as a seed crystal, the epitaxial growth locks into one or more crystalline graphic orientations of the crystalline substrate. Epitaxial growth is widely used in the manufacture of integrated circuitry and may be fabricated on various types of crystalline—base materials, for example, semiconductor substrates, and be formed of various epitaxial materials. As an example, an epitaxial silicon growth may be provided on a silicon substrate, such as bulk silicon substrates, and silicon on insulators (SOI) substrates. However, an epitaxial grown material tends to form crystalline defects, known as dislocations and stacking faults, during growth, at confined side edges of the grown material. These crystalline defects can result in undesired charge leakage within or between devices fabricated from the epitaxial material, or undesired electron-hole charge recombination sites which reduces device electrical efficiency.

FIG. 1 illustrates one example of a silicon epitaxial (EPI) material 111 formed over a bulk silicon substrate 101. The illustrated structure includes a first dielectric 103, which may be an oxide, e.g., silicon dioxide, a polysilicon 105, and a second dielectric 107, which may be silicon nitride. Materials 103, 105 and 107 may be used for transistor gate structures in an integrated circuit formed on substrate 101. An opening is provided in the materials 103, 105 and 107 which extends to and exposes the upper surface 120 of substrate 101. A silicon nitride sidewall spacer 109 is also provided on the sidewalls of the polysilicon 105 so that epitaxial growth does not occur on the polysilicon 105 sidewall. The EPI material 111 begins its growth at the exposed upper surface 120 of substrate 101. During vertical growth of the EPI material 111, stresses develop at the side edges of the growth and can produce undesirable dislocations and stacking faults 113 which encompass some distance "d".

FIG. 2 illustrates a planar view of the FIG. 1 structure later showing the dislocations and stacking faults 113 as extending around the confined side edges of EPI material 113.

One solution to the dislocation and stacking fault problem has been to use a particular crystal orientation of an underlying silicon on which the epitaxial material is grown. For example, U.S. Pat. No. 7,906,830 describes an integrated structure in which a silicon substrate orientation is changed to "111" so that silicon crystal orientation along a confined sidewall is in the "100" direction. Although the wafer reorientation described in U.S. Pat. No. 7,906,830 can reduce dislocations and stacking faults, it is often undesirable to orient the wafer in this manner for other technical reasons, such as optimizing performance of fabricated transistors and other structures.

A method and resulting structure which can produce an epitaxial growth with fewer dislocations and stacking faults and which does not require a particular crystal orientation of the substrate is desired.

DETAILED DESCRIPTION OF THE INVENTION

Figure 1:
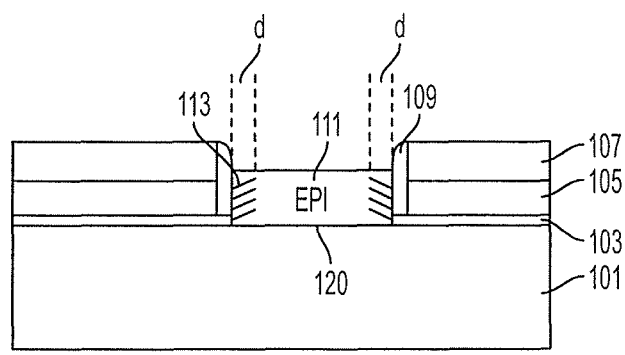
FIG. 1 illustrates in cross-section an epitaxially grown material which has dislocation and stacking faults at side edges of the material.

The invention provides a way to decrease dislocations and stacking faults at the side edges of a grown epitaxial material such as an EPI film. It provides an exposed area of a crystalline base material, for example, on a substrate upon which epitaxial growth begins. The exposed area is at the bottom of an opening formed in one or more materials on or over the crystalline base material. A dielectric which projects inwardly of the opening, is adjacent the bottom of the opening and upper surface of the crystalline base material and forms an area over which lateral epitaxial growth occurs. Thus, epitaxial growth starts at the exposed area of the crystalline base material and proceeds in a vertical and lateral direction over the area formed by the projection. The lateral projection provides an area for stress relief during growth of an EPI material, thereby reducing dislocation and stacking faults at its side edges.

Although various embodiments will be described with particular reference to a semiconductor substrate of silicon and an epitaxial growth of silicon over the substrate, the invention is not so limited and can be used in the growth of any epitaxial material over an underlying crystalline material.

The term substrate as used herein may include any crystalline base structure that has an exposed surface area on which an epitaxial material can be grown. As an example, a substrate can include bulk silicon, silicon on insulator (SOI) and, silicon on sapphire (SOS) substrates. It should further be noted that the semiconductor substrate need not be silicon based. For example, the semiconductor of the substrate can be silicon germanium, germanium, gallium arsenide or other semiconductor or crystalline materials. When reference is made to a substrate in the following description previous process steps may have been utilized to form regions or junctions in or on the substrate and/or its base foundation. The epitaxially grown material may be any such material which can be grown on a crystalline surface and is not limited to the specific materials described herein.

Also, although embodiments are described below as having a particular material stack in which an opening to a substrate surface is formed, the embodiments can employ a single material or any number of materials in which an opening may be formed. The various embodiments also depict the use of specific materials in which the opening is formed. The choice of material(s) overlying the substrate is not important as long as the opening sidewalls do not contain a material, for example a metal or semiconductor material, which could affect epitaxial growth.

Referring now to the drawings, a first embodiment of the invention will now be described.

Figure 3:
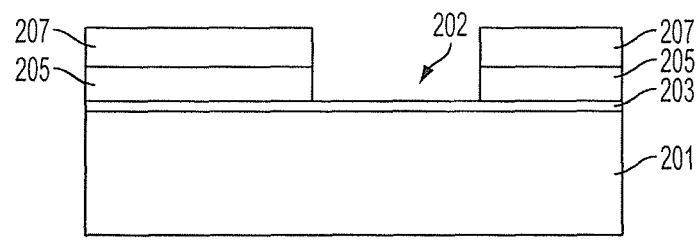
FIG. 3 represents a cross-section of a starting structure in accordance with one embodiment.

FIG. 3 illustrates the cross-sectional view of a structure which can be a starting point for an embodiment of a method and resulting structure. FIG. 3 illustrates a bulk semiconductor substrate 201 which, for discussion purposes, is a crystalline silicon substrate. The substrate is covered with a first dielectric 203 which can be an oxide, for example, silicon dioxide. A polysilicon 205 can be formed over the first dielectric 203, and a silicon nitride 207 can be formed over the polysilicon 205. The first dielectric 203, polysilicon 205 and silicon nitride 207 can be employed to form transistor gate structures at other locations (not shown) over substrate 201. The polysilicon 205 and silicon nitride 207 are shown in FIG. 3 as being etched to form an opening 202 down to the level of the first dielectric 203. Conventional wet or dry selective anisotropic etching techniques can be used to etch through the silicon nitride 207 and polysilicon 205 and stop at first dielectric 203.

Figure 4:
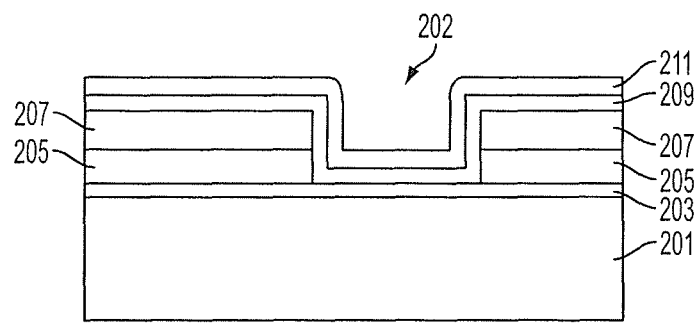
FIG. 4 illustrates the FIG. 3 structure after subsequent processing.

FIG. 4 illustrates the formation of a dielectric liner 209, e.g., a silicon nitride liner, over the surface of the nitride 207, sidewalls and bottom of opening 202 and over the exposed upper surface of the first dielectric 203. In addition, FIG. 4 shows the subsequent formation of an oxide 211, e.g., a TEOS, over the silicon nitride 209.

Figure 5:
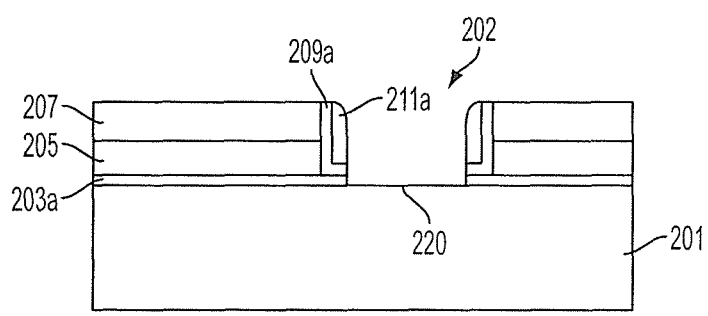
FIG. 5 illustrates the FIG. 4 structure after subsequent processing.

FIG. 5 illustrates a selective anisotropic wet or dry etching of the oxide 211, dielectric liner 209 and first dielectric 203 to the surface 220 of the substrate, leaving a portion 203a of the first dielectric 203, as well as a portion 209a of dielectric liner 209 and a portion 211a of oxide 211 on the sidewalls of the polysilicon 205 and silicon nitride 207. FIG. 5 also illustrates removal of nitride liner 211 and oxide 211 residing over nitride 207. The surface 220 of the bulk semiconductor substrate 201 has also been exposed.

Figure 6:
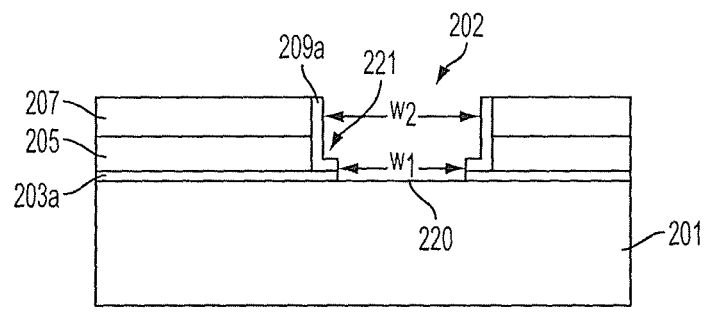
FIG. 6 illustrates the FIG. 5 structure after subsequent processing.

FIG. 6 shows the structure of FIG. 5 after the portion 211a is removed from the sides of the remaining nitride liner 209a by a conventional selective wet or dry etch. As shown, an L-shaped sidewall structure is formed from a portion 209a of the silicon nitride 211 which is over a portion 203a of the first dielectric 203. The L-shaped sidewall structure has a projection 221 which extends into the opening 202 and which is adjacent to a lower portion of opening 202 and to the exposed upper surface 220 of substrate 201. The projection defines the substrate surface 220 area at which epitaxial growth begins and forms a ledge over which lateral epitaxial growth can occur. The projection 221 effectively reduces the lateral size, e.g., width $w_1$, of the seed area where the epitaxial growth begins to a size which is less than the lateral area size e.g., width $w_2$, of the opening 202 above projection 221.

Figure 7:
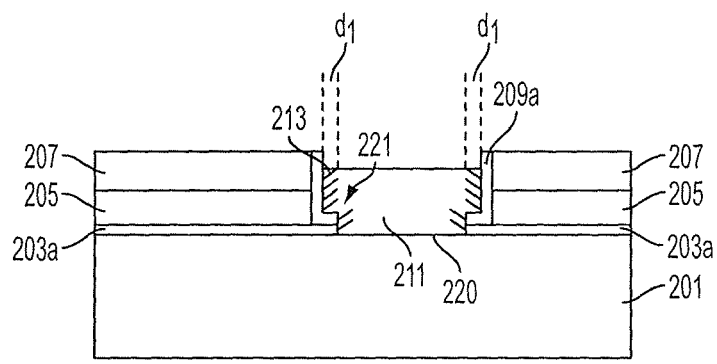
FIG. 7 illustrates the FIG. 6 structure after subsequent processing.

FIG. 7 illustrates an epitaxial growth using the exposed upper surface 220 of the semiconductor substrate 201 as the seed. As noted, for purposes of this embodiment substrate 201 is bulk silicon and the epitaxial material 212 which is grown is also silicon. As shown, the epitaxial material grows both vertically as well as laterally over the ledge formed by projection 221 of the L-shaped sidewall. The projection 221 provides an area above the projection 221 which accommodates lateral epitaxial growth. As illustrated by 213, dislocations and stacking faults 213 may still be provided at the side edges of the grown EPI layer 211; however, the distance $d_1$ from the opening 202 sidewalls where the stacking faults and dislocations occur is reduced. The lateral growth of EPI material 211 over the projection 221 reduces stress at the side edges of the EPI material 211. That is, the distance $d_1$, shown in FIG. 7, is less than the distance d shown in FIGS. 1 and 2. In addition, the reduction in stacking faults and dislocations provides a much smoother surface edge of the EPI 211 layer at its side edge. If desired, the structure illustrated in FIG. 7 may be further subject to a wet strip to remove nitride 207 and a portion of the nitride liner 209a which extends above polysilicon 205.

Figure 2:
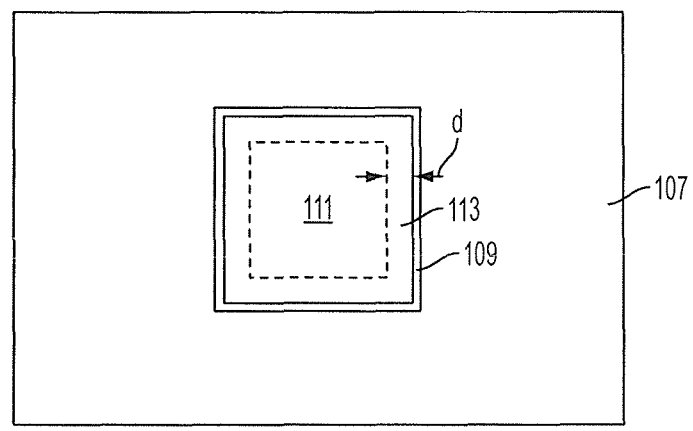
FIG. 2 is a planar view of a FIG. 1 structure showing side edge areas of dislocations and stacking faults.
Figure 8:
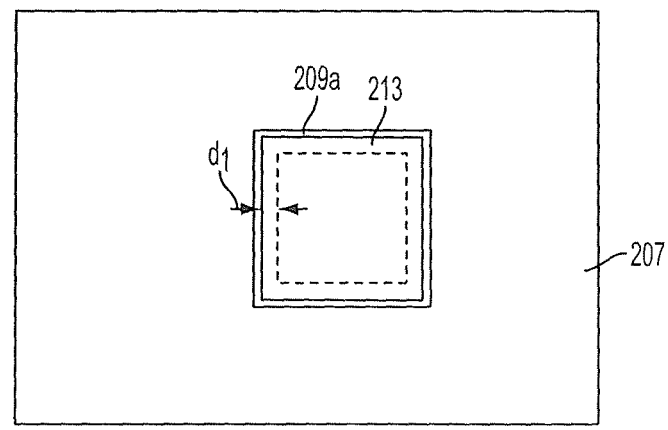
FIG. 8 is a planar view of the FIG. 7 structure showing a reduction in dislocations and stacking faults at side edges of the epitaxial growth compared to the structure illustrated in FIG. 2.
Figure 9:
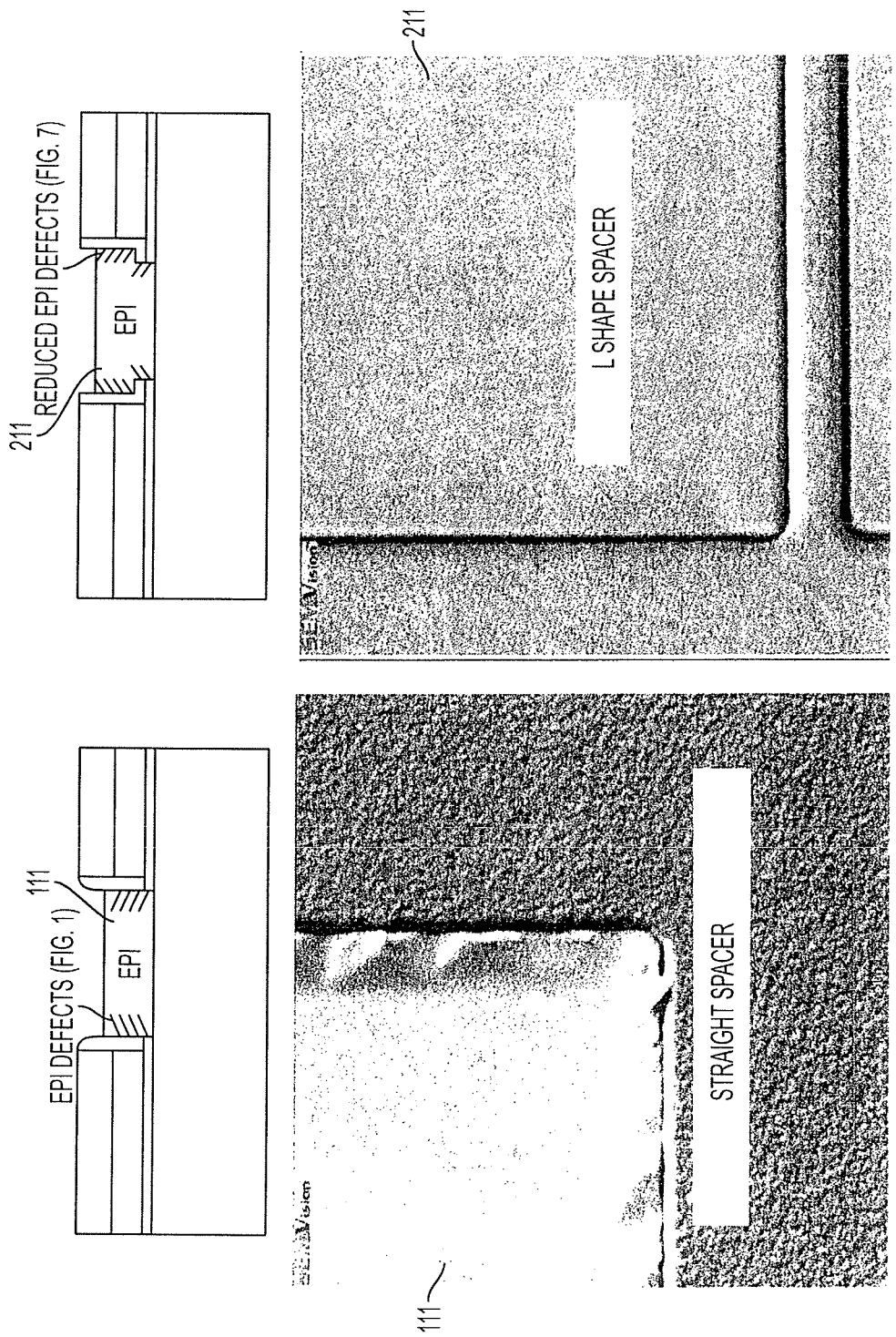
FIG. 9 is a planar SEM photo comparing an EPI growth in accordance with a first embodiment with the EPI growth shown in FIGS. 1 and 2.

FIG. 8 shows this reduced distance $d_1$, in a planar view, while FIG. 9 shows a SEM planar photograph comparing an EPI material 111 in an opening having generally straight sidewalls, as shown in FIG. 1, with an EPI material 211 in an opening having projection 221 and generally straight sidewalls above projection 221, as shown in FIG. 7. As FIG. 9 illustrates, the side edges of the EPI material 211 are smoother compared to those of EPI material 111 in the FIG. 1.

Figure 10:
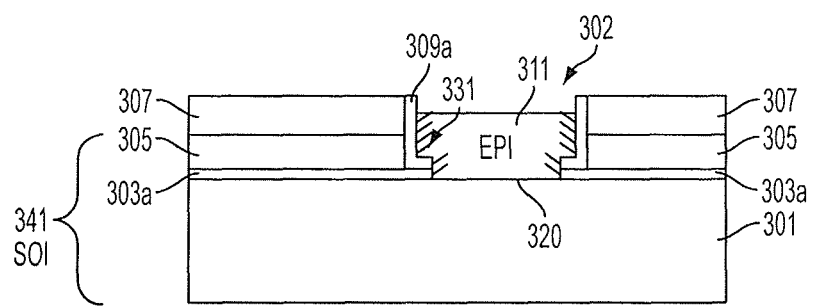
FIG. 10 illustrates in cross-sectional application of the method illustrated in FIGS. 3-8 in another embodiment employing a silicon-on-insulator substrate.

The embodiment described above with respect to FIGS. 3-9 employs a semiconductor substrate 201 which is a bulk semiconductor structure. However, FIG. 10 illustrates another embodiment in which the same process flow can be applied to an SOI structure 341 which includes a bulk semiconductor 301, an insulating material 303a (for example, silicon dioxide), and an overlying silicon material 305. A silicon nitride 307 is also formed over silicon material 305. A nitride liner 309a provides an L-shaped sidewall for opening 302 with projection 331 extending inwardly of the opening 302 from the opening 302 sidewall which reduces the area on the surface 320 of the substrate 301 and on which the EPI material 311 begins its growth. The projection 331 forms a ledge over which epitaxial growth can occur. As shown in FIG. 10, the EPI material 311 grows both vertically and laterally over the projection with the area over projection 331 providing stress relief thereby reducing dislocation and stacking faults at the side edges of the EPI material 311.

Figure 11:
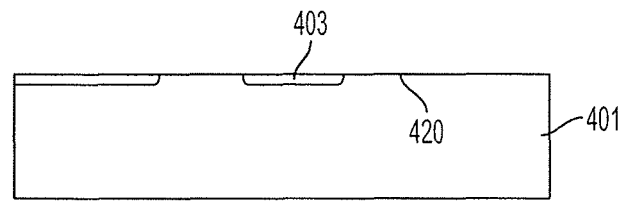
FIG. 11 illustrates in cross-section a starting structure for another embodiment.
Figure 12:
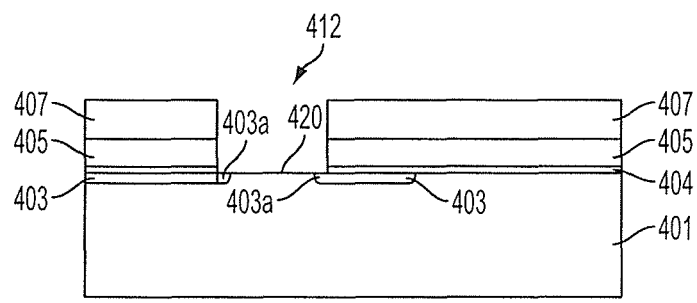
FIG. 12 illustrates the FIG. 11 structure after subsequent processing.
Figure 13:
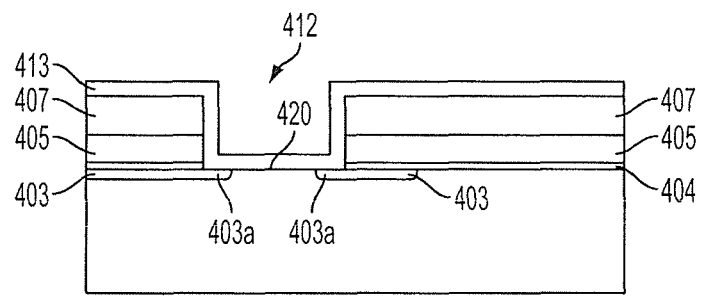
FIG. 13 illustrates the FIG. 12 structure after subsequent processing.

Another embodiment is illustrated in FIGS. 11-15. FIG. 11 illustrates a starting structure which includes a semiconductor substrate 401, for example, a bulk silicon substrate 401 in which dielectric regions, such as trench isolation regions 403, are formed which extend from the substrate surface into the substrate 401. The trench isolation regions can be deep trench isolation regions or shallow trench isolation (STI) regions. The trench isolation regions 403 can have an upper surface which extends above the surface of the substrate 401, can be planarized to the level of the substrate 401, or can be recessed relative to the surface 420 of the substrate 401. As further illustrated in FIG. 12, an oxide 404, e.g., silicon dioxide, and a semiconductor material such as polysilicon 405 can be formed over substrate 401, and a dielectric 407, for example, a silicon nitride can be formed over the polysilicon 405. The oxide, polysilicon, and silicon nitride 404, 405 and 407 are then selectively anisotropically wet or dry etched to form an opening 412 which extends to the substrate surface 420 and has a lateral extent over projected edges 403a of the trench isolation regions 403. The projected edges 403a form a ledge over which epitaxial growth can later occur. Next, as illustrated in FIG. 13, a silicon nitride liner 413 is formed over the dielectric 407 and on the sidewalls and bottoms of the opening 412.

Figure 14:
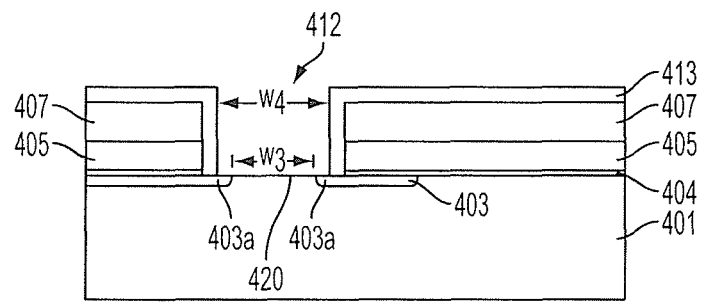
FIG. 14 illustrates the FIG. 13 structure after subsequent processing.

As illustrated in FIG. 14, the silicon nitride liner 413 is selectively anisotropically wet or dry etched at the bottom of the opening 412 to expose the upper surfaces of the projecting portions 403a of the isolation regions 403 as well as the upper surface 420 of semiconductor substrate 401. The projection portions 403a of the isolation regions 403 are located adjacent the bottom of opening 412 and the upper surface 420 of substrate 401. The projecting portions 403a cause the lateral area, e.g., width $w_4$, of the opening 412 above projections 403a to be larger than the exposed lateral area, e.g., width $w_3$, at the upper surface 420 of substrate 401.

Figure 15:
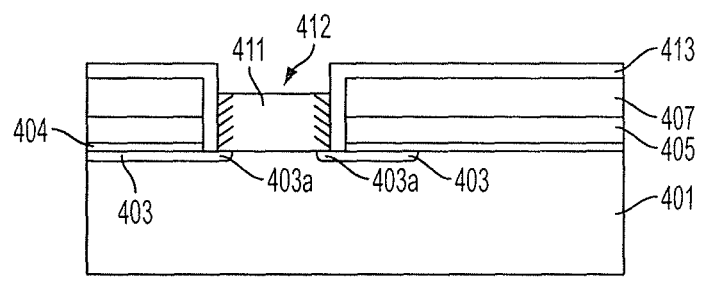
FIG. 15 illustrates the FIG. 14 structure after subsequent processing.

As shown in FIG. 15, an EPI material 411 is grown within the opening 412. The EPI material 411 is grown both vertically and laterally within the opening 412 such that edge portions of the EPI material 415 extend over the ledge formed by projecting portions 403a of the trench isolation regions 403. The projecting portions of the trench isolation regions 403a permit stress relief during lateral growth of the EPI material 411 and reduces dislocations and stacking faults at the side edges of EPI material 411.

Depending on further processing needed, the illustrated structure can be planarized to the level of the EPI material 411 or level of polysilicon 405 with a thin nitride along sidewalls of the opening 412 separating the EPI material 411 from the polysilicon 405.

Figure 16:
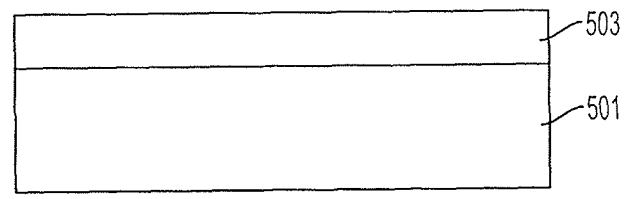
FIG. 16 illustrates in cross-section of a starting structure for another embodiment.

Another embodiment is shown in FIGS. 16-22. FIG. 16 illustrates in cross-section a starting structure which includes a semiconductor substrate 501 of, for example, bulk crystalline silicon. A dielectric material 503 is formed over the substrate 501. The dielectric material can be, for example, a single material such as silicon nitride or other dielectric material such as an oxide, or a stack of the same or different dielectric materials.

Figure 17:
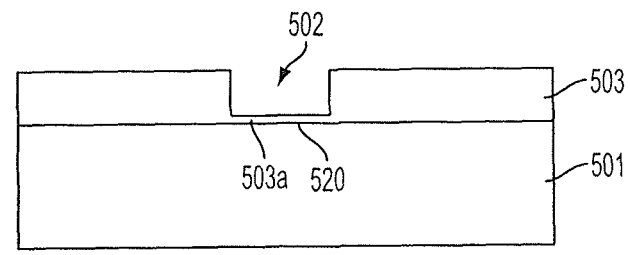
FIG. 17 illustrates the FIG. 16 structure after subsequent processing.

As shown in FIG. 17, a first anisotropic wet or dry etch of the dielectric material 503 can be performed to form an initial opening 502. The etch is stopped before the surface 520 of the substrate is reached, leaving a portion 503a of the dielectric material 503 at the bottom of opening 502.

Figure 18:
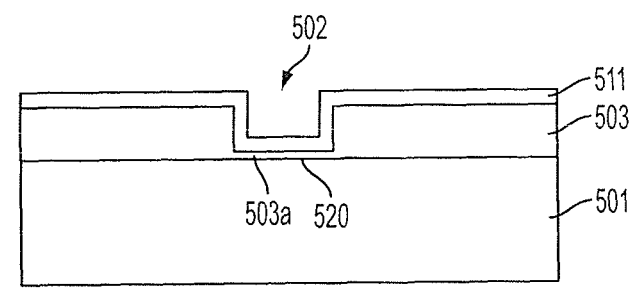
FIG. 18 illustrates the FIG. 17 structure after subsequent processing.
Figure 19:
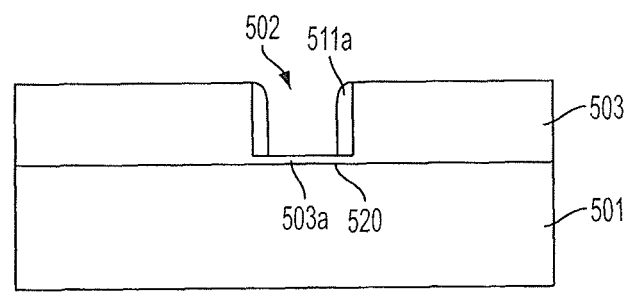
FIG. 19 illustrates the FIG. 18 structure after subsequent processing.

FIG. 18 shows the formation of another dielectric material 511 over the dielectric material 503 and at the sidewalls and bottom of opening 502. This other dielectric material 511 may be an oxide, for example, silicon dioxide or TEOS or silicon nitride. The dielectric material 503 may be different from the other dielectric material 511 to allow a selective etch of one relative to the other. The other dielectric material 511 is then removed from the bottom of opening 502 by a selective wet or dry etch and from the upper surface of the dielectric material 503, leaving spacers 511a on the sidewalls of the opening 502, as shown in FIG. 19.

Figure 20:
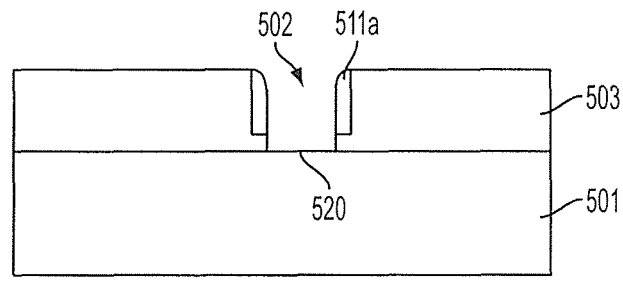
FIG. 20 illustrates the FIG. 19 structure after subsequent processing.
Figure 21:
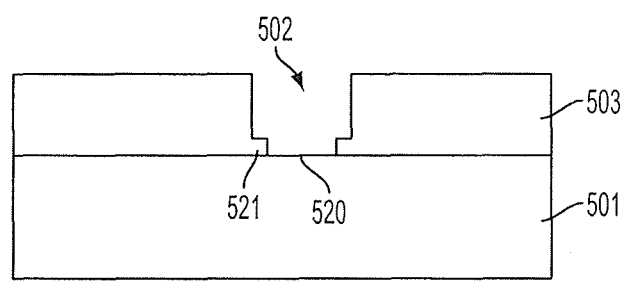
FIG. 21 illustrates the FIG. 20 structure after subsequent processing.

As shown in FIG. 20 the remaining portion 503a of dielectric material 503 at the bottom of opening 502 is etched to the surface 520 of substrate 501. Following this, as shown in FIG. 21, the spacers 511a are removed by a selective wet or dry etch leaving projections 521 adjacent the bottom of opening 502 and upper surface 520 of substrate 501 which form an L-shaped sidewall at the bottom of opening 502. The projections 521 provide a ledge over which epitaxial growth can occur.

Figure 22:
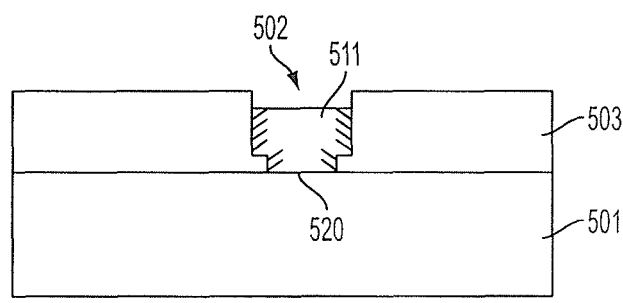
FIG. 22 illustrates the FIG. 21 structure after subsequent processing.

FIG. 22 shows the growth of an EPI material 511 within opening 502. As with other embodiments, the epitaxial material grows vertically and laterally within opening 502 and over the ledge provided by projections 521. This provides stress relief and reduces dislocations and stacking faults at the side edges of the epitaxial layer 512.

Another embodiment is illustrated in FIGS. 23-27.

The above-described embodiments illustrate an EPI material which is formed in an opening having generally straight vertical sidewalls. FIGS. 23-27 illustrate an embodiment in which the sidewalls of the opening slope downwardly and inwardly of the opening. Thus, the lateral size of the area of the opening progressively enlarges from the contact area at which EPI growth begins to the uppermost portion of the opening to provide an area to accommodate lateral growth of the EPI material over the slanted sidewall. The sloped sidewalls provide stress relief at the side edges of the EPI material as it grows.

Figure 23:
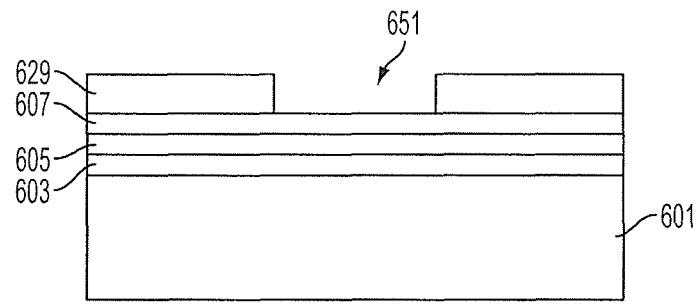
FIG. 23 illustrates in cross-section the starting structure for another embodiment.
Figure 24:
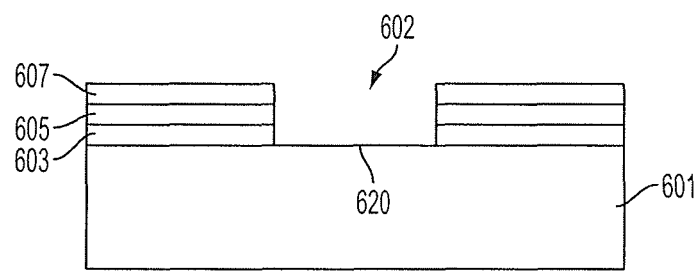
FIG. 24 illustrates the FIG. 23 structure after subsequent processing.

FIG. 23 illustrates an example of a starting structure for this embodiment. A semiconductor substrate 601, for example, a bulk silicon substrate has an oxide 603, a semiconductor 605, e.g., silicon, or polysilicon, and an overlying dielectric 607, for example, of silicon nitride. FIG. 23 also shows an etch mask 629 having an opening 651 therein. The mask 629 is used to anisotropically wet or dry etch through the oxide 603, semiconductor 605 and nitride 607 forming an opening 602 which extends to the upper surface 620 of substrate 601, as shown in FIG. 24. FIG. 24 also shows removal of mask 629.

Figure 25:
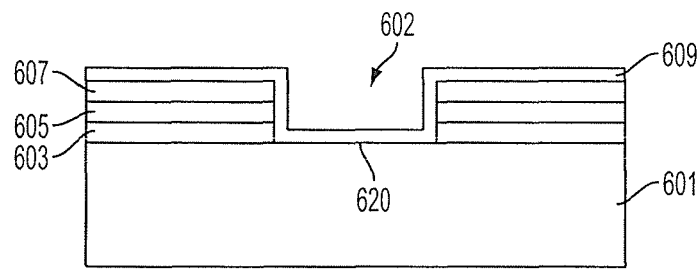
FIG. 25 illustrates the FIG. 24 structure after subsequent processing.
Figure 26:
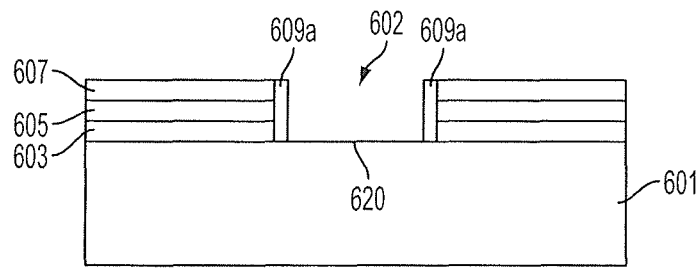
FIG. 26 illustrates the FIG. 25 structure after subsequent processing.

As shown in FIG. 25 a dielectric liner 609 formed, for example, of silicon nitride is deposited over the nitride 607 and along the sidewalls and bottom of opening 602. The dielectric liner 609 is anisotropically wet or dry etched to remove the liner from the upper surfaces of the nitride layer 607 and bottom of the opening 602 to expose upper surface 620 of the semiconductor substrate 601, as shown in FIG. 26. The sidewalls of opening 602 have portions 609a of the dielectric liner 609 remaining in place.

Figure 27:
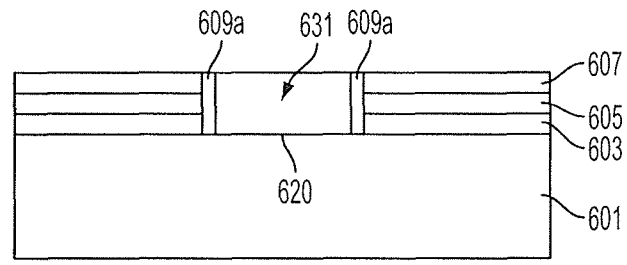
FIG. 27 illustrates the FIG. 26 structure after subsequent processing.
Figure 28:
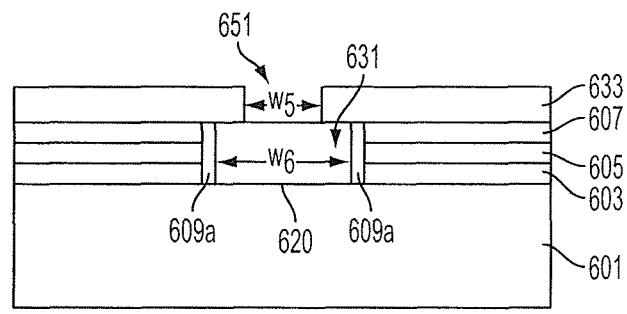
FIG. 28 illustrates the FIG. 27 structure after subsequent processing.
Figure 29:
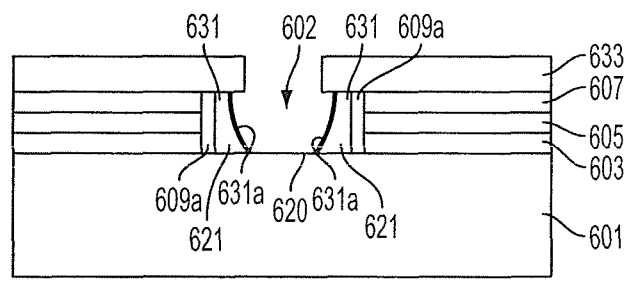
FIG. 29 illustrates the FIG. 28 structure after subsequent processing.

As shown in FIG. 27, the opening 602 is next filled with an oxide 631 which is planarized to the upper surface of nitride 607. Then, as shown in FIG. 28, a patterned mask 633 is formed to extend over oxide 631. The patterned mask has an opening 651 centered over the oxide 631. The lateral area, e.g., width $w_5$, of opening 651 is smaller than that, e.g., width $w_6$, of oxide 631. The opening 651 is used to isotropically wet etch the oxide 631 to the upper surface 620 of the semiconductor substrate forming sloped sidewalls 631a which extend inwardly and downwardly within opening 602. The sloped sidewalls 631a define a projection 621 which extends inwardly of opening 602 and to the contact surface 620 of the semiconductor substrate to define the seed area at surface 620 at which EPI growth begins.

Figure 30:
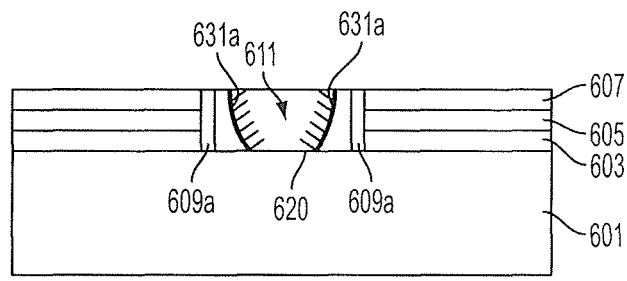
FIG. 30 illustrates the FIG. 29 structure after subsequent processing.

As shown in FIG. 30 the mask 633 is removed, after which EPI growth begins at the surface 620 of the semiconductor substrate and continues vertically and laterally within opening 602. The sloped sidewalls 631a can be flat or slightly curved, depending on the etching conditions. Thus, stress relief is provided along the sidewalls 631a for the EPI material 611 as it grows.

Although particular materials are described with respect to forming an opening in one or more materials overlying a substrate for epitaxial growth it should be understood that the invention is not limited to the specific embodiments or materials discussed. Any overlying material which has a projection adjacent the bottom of the opening and upper surface of the substrate on which lateral can occur can be used. This arrangement provides stress relief and reduces the number of dislocations and stacking faults present at side edges of the growing EPI material.

Also, in the embodiments described an opening is provided in one or more materials which are formed over a substrate. The one or more materials in which the opening is formed can remain in place and be part of a constructed integrated circuit, or one or more of the materials can be sacrificial which is removed after EPI growth is completed.

As is apparent various modifications can be made in the materials and arrangements described herein without departing from the spirit and scope of the invention. Accordingly, the invention is not limited by the foregoing description, but is only limited by the scope of the appended claims.

What is claimed as new and desired to be protected by Letters Patent of the United States is:

1. An integrated structure, comprising along a cross-section:
   a crystalline substrate;
   a first dielectric over the crystalline substrate;
   a stack over the first dielectric, the stack comprising silicon nitride over semiconductor material;
   an opening through the stack and the first dielectric to the crystalline substrate;
   the opening having a first width region extending through the stack and having a second width region extending through the first dielectric; the first and second width regions having first and second widths, respectively; the second width being less than the first width; the first dielectric having projections extending laterally inward and under the first width region of the opening, and the first dielectric extending under the stack;
   L-shaped liners of second dielectric material along sidewalls of the opening; the L-shaped liners having long vertically-extending regions joining to short horizontally-extending regions; the vertically-extending regions of the L-shaped liners being adjacent and against both the silicon nitride and the semiconductor material of the stack; the horizontally-extending regions of the liners being over and against the projections of the first dielectric; the L-shaped liners narrowing the first width region of the opening to a third width which is less than the first width and greater than the second width; the narrowed first width region being a third width region; the L-shaped liners being entirely over the first dielectric material and not narrowing the second width region of the opening; and
   an epitaxial material within the second and third width regions.

2. The integrated structure of claim 1 wherein the first dielectric comprises silicon dioxide.

3. The integrated structure of claim 1 wherein the semiconductor material of the stack comprises silicon.

4. The integrated structure of claim 1 wherein the L-shaped liners comprise silicon nitride.

5. The integrated structure of claim 1 wherein the epitaxial material comprises silicon.

6. The integrated structure of claim 1 wherein the crystalline substrate comprises silicon.

* * * * *